United States Patent
Tsai et al.

(10) Patent No.: US 6,876,939 B2
(45) Date of Patent: Apr. 5, 2005

(54) METHOD AND DEVICE OF CARRIER WAVE FREQUENCY CALIBRATION FOR REMOTE CONTROLLER

(75) Inventors: Rong-Dzung Tsai, Hsinchu (TW); Chao-Kuo Lee, Hsinchu (TW)

(73) Assignee: Holtek Semiconductor Corp., Hsinchu (TW)

( * ) Notice: Subject to any disclaimer, the term of this patent is extended or adjusted under 35 U.S.C. 154(b) by 0 days.

(21) Appl. No.: 10/721,287

(22) Filed: Nov. 26, 2003

(65) Prior Publication Data

US 2004/0143409 A1 Jul. 22, 2004

(30) Foreign Application Priority Data

Jan. 21, 2003 (TW) ........................................ 92101185 A

(51) Int. Cl.⁷ ............................................. G01R 35/00
(52) U.S. Cl. ...................... 702/106; 702/85; 702/107; 327/100; 377/29; 455/130
(58) Field of Search .................... 702/106, 85, 107; 455/130, 227, 151.1; 340/825.57, 825.75; 327/100, 29, 106, 114

(56) References Cited

U.S. PATENT DOCUMENTS 3,571,720 A * 3/1971 Heagney .................. 455/187.1
2003/0112906 A1 * 6/2003 Pigott et al. ................ 375/354
2004/0201403 A1 * 10/2004 Chen et al. ................... 327/39

* cited by examiner

Primary Examiner—John Barlow
Assistant Examiner—Hien Vo
(74) Attorney, Agent, or Firm—Troxell Law Office, PLLC

(57) ABSTRACT

The present invention discloses wave frequency calibration method and device for remote controller, the device of the present invention comprises an oscillator for generating a base wave; a storage for storing a match value; a modifier for generating a modified signal; and a processor connected to the oscillator, the storage and the modifier, the processor change the match value until the modified signal disappear and store the most updated match value in the storage to assure the receiving end of the remote controller can receive the signal with correct frequency. Incorporating with a RC oscillator, the wave frequency calibration method and device for remote controller of the present invention will avoid the problem of the bias of wave, which enables the RC oscillator to be an oscillator that can be used commonly in a regular remote controller.

15 Claims, 4 Drawing Sheets

METHOD AND DEVICE OF CARRIER WAVE FREQUENCY CALIBRATION FOR REMOTE CONTROLLER

BACKGROUND OF THE INVENTION

1. Field of the Invention

The present invention generally relates to wave frequency calibration method and device for remote controller, more particularly, to wave frequency calibration method and device for remote controller that employs resistor-capacitor type oscillator.

2. Description of the Prior Art

Remote controller is wildly used in our daily life and is applied in many filed, e.g. security equipment, house appliances, audio/video equipment and air conditioner, etc., in which remote controller had played an important roll for improving the convenience of usage.

Please refer to FIG. 1, which is a diagram showing an operation flow of a remote controller in accordance to prior arts. As seen, the remote controller comprises a transmitting end 1 and a receiving end 2. The transmitting end 1 further comprises: an oscillator 11 for generating a carrier wave 110 based on a designated frequency; a controller 12 for generating a control instruction 120 based on an user's instruction; a modulator 13 connected to the oscillator 11 and the controller 12, for generating an output signal 130 by modulating the carrier wave 110 and the control instruction 120; a transmitter 14 for outputting the output signal 130 by a wireless method, such as using infrared or radio frequency. In order to avoid interference, the receiving end 2 usually is designed to receive the carrier wave 110 of a predetermined frequency. After receiving the output signal 130, the receiving end 2 will demodulate and recover the control instruction 120, and complete the whole work based on the instruction.

To assure the output signal 130 be received by the receiving end 2, an accurate carrier wave 110 is required, hence, an advanced and sophisticated oscillator is required for faithfully generating the stationary carrier wave 110. The crystal oscillator is commonly used in the industry for having characteristics of high stability and high accuracy. However, the sophisticated crystal oscillator is very expensive that it takes almost one fourth of total cost of the remote controller. Therefore, seeking the best replacement of the expensive crystal oscillator, i.e. an oscillator 11 with low cost, is the major and common concern in the industry.

Another commonly used oscillator in the market is the so-called resistor-capacitor type oscillator (RC oscillator), which is an oscillator constructed using the resonance characteristic happened between a resistor and a capacitor. Although the cost of the RC oscillator is relatively low, however, its quality is not stable since the property of the resistor and capacitor is subject to change due to the variation of temperature of the environment. General speaking, the error of the resistor is around 5~20%, and the error of the capacitor is around 20~30%. The oscillating frequency of a RC oscillator is related to the product of the resistance and the capacitance, therefore, the error of the RC oscillator can be as high as more than 50%, which is a major concern when the RC oscillator is put into use as an oscillator inside the remote controller, even though it has the advantage of low cost.

Therefore, the present invention can provide a method and a device of wave frequency calibration for remote controller. Incorporating the present invention with a RC oscillator, the foregoing problem of the bias of wave frequency can be avoid, which enables the RC oscillator to be an oscillator which can be used commonly and widely in remote controller for lowing production cost.

SUMMARY OF THE INVENTION

Accordingly, it is the primary objective of the present invention to provide a method and a device of wave frequency calibration for remote controller, which can automatically collaborate the wave frequency of an oscillator.

The second objective of the present invention is to provide a method and a device of wave frequency calibration for remote controller that can be applied to all kind of oscillator.

In order to achieve the foregoing objectives, the device of wave frequency calibration for remote controller according to the present invention comprises:

an oscillator for generating a base wave;

a storage for storing a match value;

a modifier for generating a modified signal; and a processor connected to the oscillator, the storage and the modifier, when the modified signal is not received by the processor, the processor will calculate the number of variation of the potential of the base wave so as to generate a count value, and once the count value is the same as the match value, the potential of the wave is changed, moreover, when the processor receives the modified signal, the processor will keep altering the match value until the modified signal disappear and thereafter store the updated match value into the storage.

In addition, the method of wave frequency calibration for remote controller of the present invention, which incorporates a storage for storing a match value, comprises the following steps:

(a) checking whether a modified signal is received, if yes, performing step (b); otherwise, performing step (f);

(b) changing the match value and generating a wave for carrying a control instruction according to the changed match value;

(c) delaying a period of time;

(d) checking whether the modified signal is released, if yes, performing step (e); otherwise, performing the step (b);

(e) storing the match value into the storage;

(f) loading the match value from the storage;

(g) calculating the number of variation of the potential so as to generate a count value;

(h) checking whether the count value is equal to the match value, if yes, performing step (i); otherwise, performing the step (g);

(i) changing the potential of a wave, and resetting the count value and then performing the step (g).

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

DETAILED DESCRIPTION OF THE INVENTION

Figure 1:
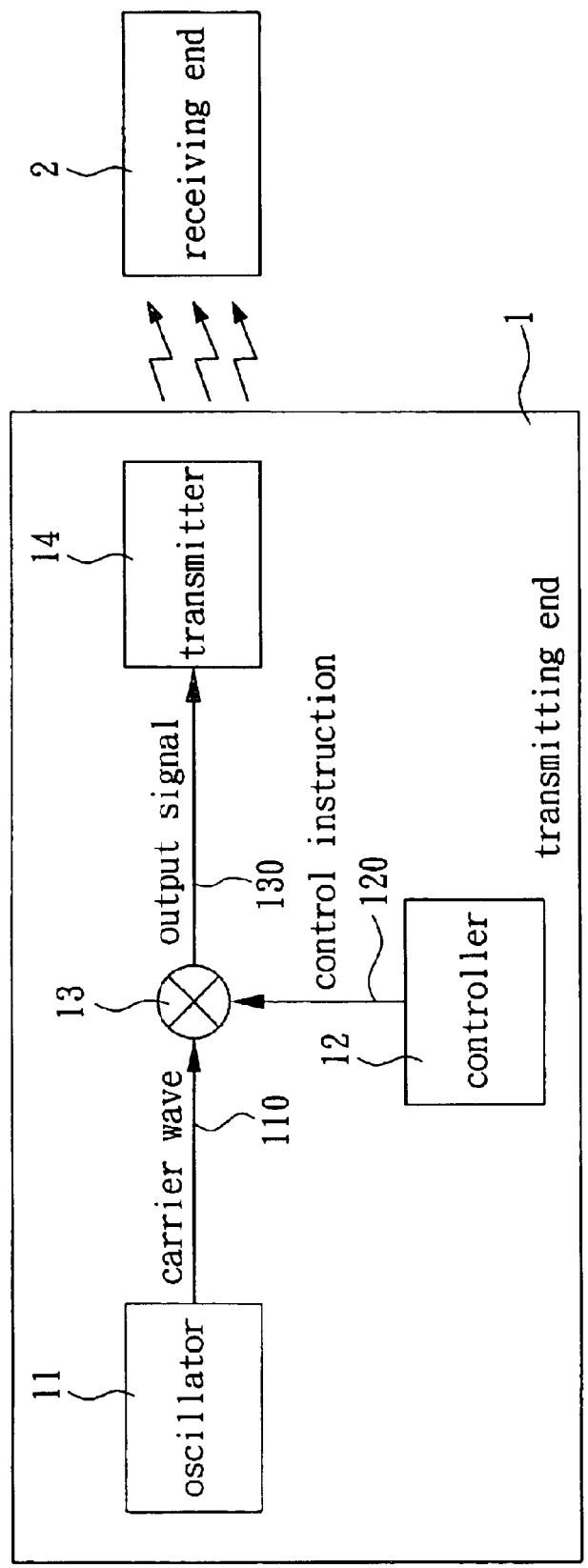
FIG. 1 is a schematic block diagram showing the operation flow of a traditional remote controller.

The objects, spirits and advantages of the present invention will be readily understood by the accompanying drawings and detailed descriptions, wherein:

Since the oscillating frequency of a RC oscillator is subjected to the variation of environment, the present invention, instead of directly adopting the absolute frequency generated by the RC oscillator, will employ a relative frequency, that is, a wave whose frequency is a multiple of the frequency generated by the RC oscillator, so that the generated frequency can match with the specific frequency that can be received by the receiving end under the condition of not changing the design of the receiving end 2 of FIG. 1.

Figure 2A:
FIGS. 2A, 2B and 2C are the diagrams showing different forms of wave.
Figure 2B:
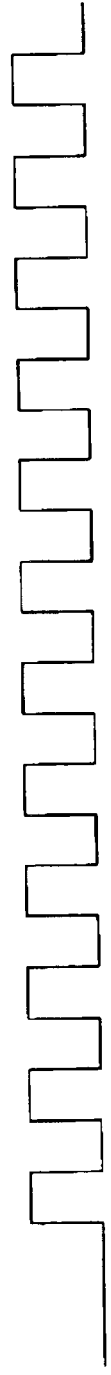
Figure 2C:
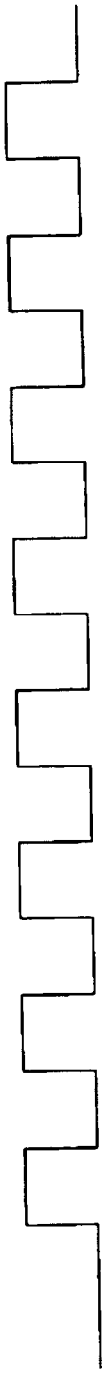

Please refer to FIGS. 2A, 2B and 2C, wherein, FIG. 2A is the waveform of the carrier wave 110 that can be received by the receiving end 2, and FIG. 2B is the waveform generated by a RC oscillator under a certain environment. As seen in the FIG. 2B, under the certain environment, the period of the carrier wave 110 is six times the period of the frequency generated by the RC oscillator. When the environment is changed, the output frequency of the RC oscillator will change accordingly, and some adjustment will therefore be required. As shown in the FIGS. 2A and 2C, when the multiple factor is adjusted to 4, the output frequency of the RC oscillator will be able to match with the frequency of the carrier wave 110 again, and thus, the receiving end 2 is capable of receiving the output signal. Although the receiving end 2 of the remote controller can only receive the output signal of the carrier wave 110 having a specific frequency, but in real world, some minor frequency error of the carrier wave 110 is tolerable, therefore, if the error can be controlled within a tolerance of the receiving end 2, the operation of remote control can still be achieved.

Figure 3:
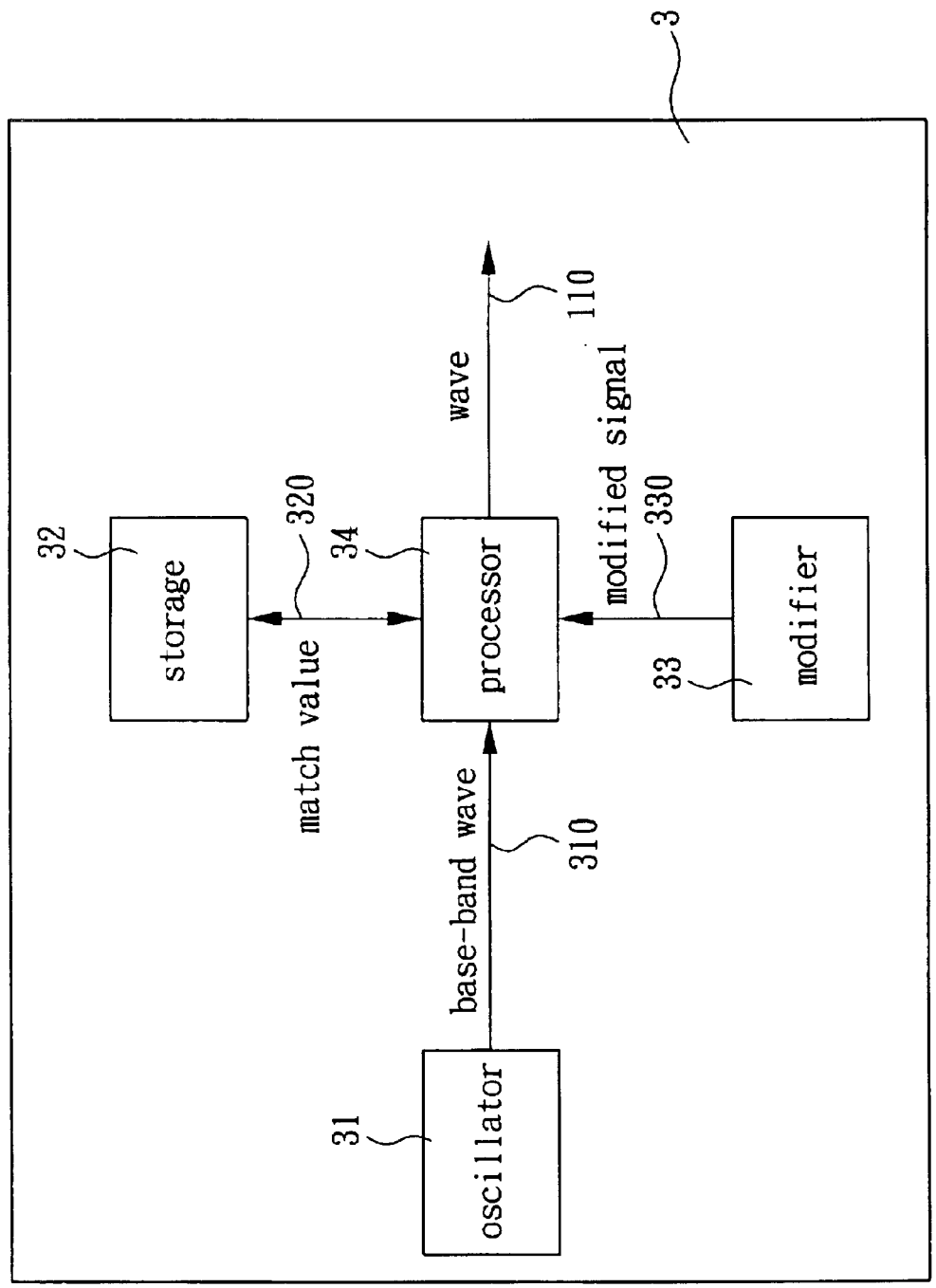
FIG. 3 is an architecture diagram of the present invention.

Please refer to FIG. 3, which is an oscillator of the present invention capable of replacing the traditional oscillator of FIG. 1. The wave frequency calibration device for remote controller according to the present invention comprises:

an oscillator 31 for generating a base-band wave 310 based on the base frequency of the oscillator;

a storage 32 for storing a match value 320;

a modifier 33 for generating a modified signal 330; and a processor 34 connected to the oscillator 31, the storage 32 and the modifier 33, when the modified signal 330 is not received by the processor 34, the processor 34 will calculate the number of variation of potential of the base-band wave 310 so as to generate a count value 340, and once the count value 340 is equal to the match value 320, the potential of the carrier wave 110 is changed, moreover, when the processor 34 receives the modified signal 330, the processor 34 will keep changing the match value 320 until the modified signal 330 disappear, and then store the most updated match value 320 in the storage 32.

In fact, the modifier 33 can be installed as any button on the remote controller. Just after the button of the modifier 33 has been pressed for a certain period, such as one second, the modified signal 330 will be generated and outputted to the processor 34 until the button of the modifier 33 is released.

Figure 4:
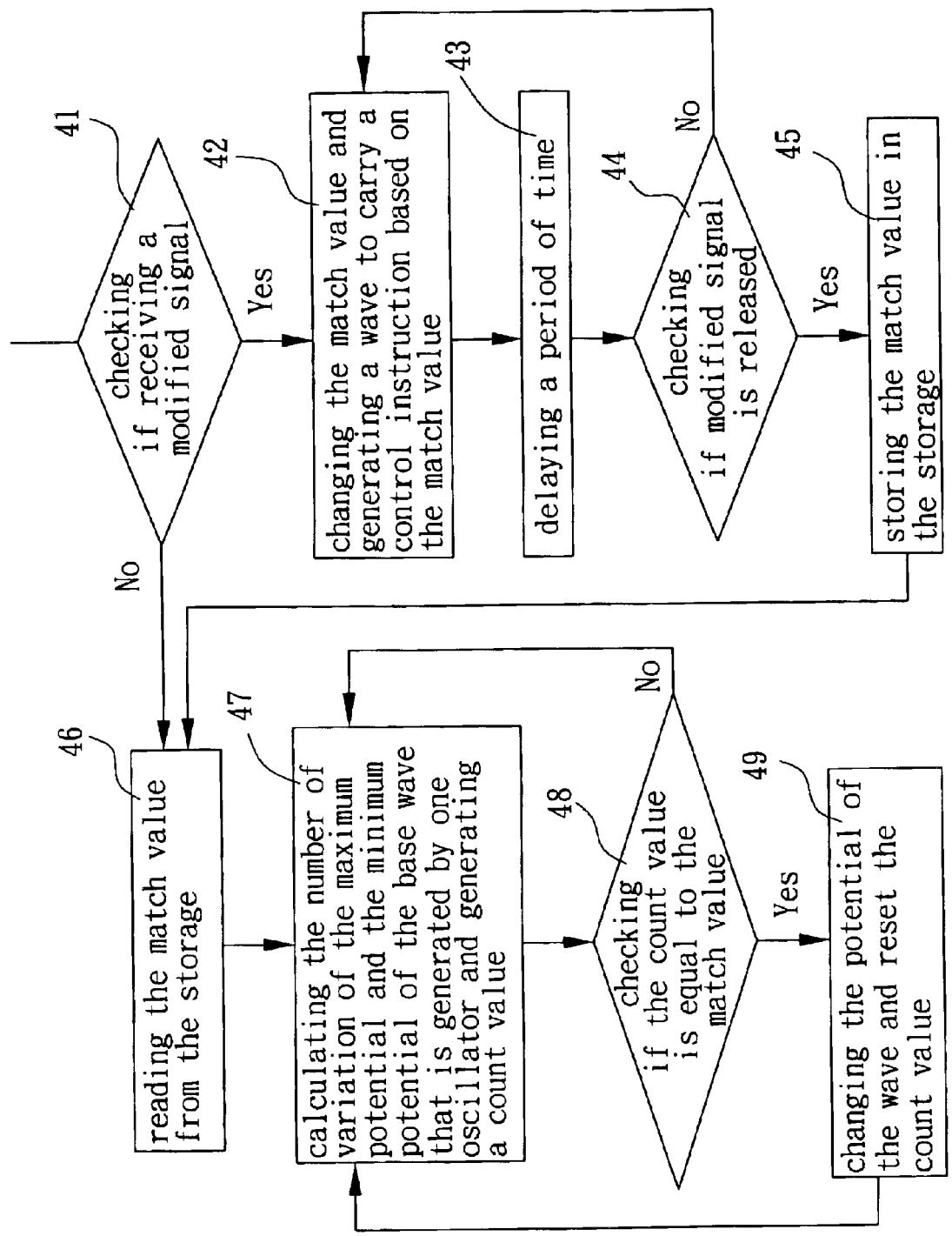
FIG. 4 is an operation flowchart of the present invention.

Please refer to FIG. 4, which is an operation flowchart of the present invention. As seen, the wave frequency calibration method for remote controller of the present invention, incorporating a storage for storing a match value 320, comprises the following steps:

Step 41. checking whether receiving a modified signal 330, if yes, performing the step 42; otherwise performing the step 46; for example, if one of the button on the remote controller is being pressed for more than one second, a modified signal will be generated for indicating an occurrence of frequency bias and requiring an action of frequency calibration.

Step 42. changing the match value 320 and generating a carrier wave 110 to carry a control instruction 120 based on the changed match value 320; the failure of using the match value 320 to generate the desired wave frequency 100 is always regarded as the major reason accounting for the happening of frequency bias, thus, a proper modification for the match value 320 will rectify the frequency bias, and also, there are many ways that can be used to modify the match value 320, such as modifying the match value 320 with a regular sequence as: "the match value +1", "the match value −1", "the match value +2", "the match value −2", "the match value +3", and so on, or modifying the match value 320 with an experiment-proven sequence as: "the match value +4", "the match value −2", "the match value +6", "the match value −1", "the match value +3", . . . and so on.

Step 43. delaying a period of time; after the matched value is changed, a period of delay is required for both the user and the mechanic parts be able to response.

Step 44. checking whether the modified signal is released, if yes, performing the step 45; otherwise, performing the step 42; that is, if the desired operation is completed, the user will naturally release the pressed button and the generation of the modified signal is stopped, which means the calibration is accomplished; otherwise, the calibration is not success and the calibration should be continued.

Step 45. storing the match value 320 in the storage; after the calibration is accomplished, the match value accomplishing the calibration is stored in the storage that the match value can be read in directly without executing the calibration.

Step 46. loading the match value 320 from the storage;

Step 47. calculating the number of variation of potential of the base-band wave 310 generated by an oscillator 11 so as to generate a count value 340; in this step, the multiple factor between the frequency of the carrier wave 110 and the base-band wave 310 is adjusted, and the multiple factor is the match value 320, in this regard, each variation of the potential of the base-band wave 310 indicates that the multiple factor should be added by one, which also means the count value 340 should be added by one.

Step 48. checking whether the count value 340 is equal to the match value 320, if yes, performing the step 49; otherwise, performing the step 47; that is, when the count value 340 is equal to the match value 320, the target multiple factor is achieved.

Step 49. changing the potential of a carrier wave 110, that is, when the count value is equal to the match value, the carrier wave 110 with the desired frequency can be obtained by changing the potential of the carrier wave 110, and the same time, the count value is needed to be reset to zero, the step 47 is thereafter performed so that the desired carrier wave 110 will be generated continuously.

Since the multiple factor is a integer, the maximum error in the present invention will occur between the counts, that is, the maximum error is happened when the period of the carrier wave 110 is the multiple of the base period plus 0.5. Taking an embodiment for example, the most common frequency used in an infrared remote controller is 56.9 KH, thus, assuming that a frequency of 567.5 KHz is incorporated with a match value 10, an ideal wave with a frequency of 56.75 KHz will be obtained, the percentage of the difference form the standard frequency (56.9 KHz) is only around 0.26%. The maximum error will happen between the match value 10 and 11, if the frequency of the wave is 54.05 KHz, the percentage of the difference is only around 4.7%. Since the accuracy of the frequency required for a commonly used remote controller is not so rigid, the above difference is within the range that is acceptable. It is certain that it would be better if higher frequency can be obtained, in that case, the difference will be decreased. Therefore, incorporating with the present invention, even an oscillator with larger frequency error, such as a RC oscillator, will be able to be employed by a common remote controller.

Basically, a regular remote controller will not consume a lot of electric power, which means even removing the battery from the remote controller, the electric power hold on the device will maintain the data stored in the storage of the device for a period of time (say at least 20 minutes). Therefore, the calibration may only need to be done once, after that the correct data will be stored in the remote controller without any further calibration. In a preferred embodiment, DRAM will be regarded as a better alterative to maintain the correct data in a remote controller.

In general, the present invention employs an oscillator 11 to generate a base wave, incorporating with a match value 320 to generate a carrier wave 110. When a frequency bias happened in a remote controller due to some environment factor and a calibration is required, a certain sequence of operation are needed to be perform in order to enable the receiving end of the device to receive the wave with correct frequency, and which is the purpose of the calibration that present invention presents.

Since the maximum error in the present invention will occur between the counts, which means it happen when the period of the carrier wave 110 is the multiple of the base-band period 310 plus 0.5. However, since the accuracy of the frequency required for a common used remote controller is not so rigid, the difference within a reasonable range will be acceptable. Therefore, incorporating with the present invention, even an oscillator with some larger frequency error, such as a RC oscillator, will be able to be employed by a remote controller. In addition, the function of the present invention not only can be achieved by hardware, but also by software or firmware.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A device of wave frequency calibration for remote controlled, comprising:

an oscillator for generating a base wave;

a storage for storing a match value;

a modifier for generating a modified signal; and a processor connected to the oscillator, the storage and the modifier, when the modified signal is not received by the processor, the processor will calculate the number of variation of the potential of the base wave so as to generate a count value, and once the count value is the same as the match value, the potential of the wave is changed, moreover, when the processor receives the modified signal, the processor will keep altering the match value until the modified signal disappear and thereafter store the updated match value into the storage.

2. The device of wave frequency calibration for remote controller as cited in claim 1, wherein the oscillator can be an oscillator of less accuracy.

3. The device of wave frequency calibration for remote controller as cited in claim 2, wherein the oscillator can be a resistor-capacitor type oscillator (RC oscillator).

4. The device of wave frequency calibration for remote controller as cited in claim 1, wherein the modifier can be one of the buttons on the remote controller that the modified signal is generated when the button is pressed and held.

5. The device of wave frequency calibration for remote controller as cited in claim 4, wherein the button can be released to stop the modified signal.

6. The device of wave frequency calibration for remote controller as cited in claim 1, wherein the processor can follow a specific sequence to change the match value.

7. The device of wave frequency calibration for remote controller as cited in claim 1, wherein the period of the wave is a multiple of the period of the base wave.

8. The device of wave frequency calibration for remote controller as cited in claim 1, wherein the maximum error of the period of the wave is the half period of the base wave.

9. A method of wave frequency calibration for remote controller, comprising the following steps:

(a) checking whether a modified signal is received, if yes, performing step (b); otherwise, performing step (f);

(b) changing the match value and generating a wave for carrying a control instruction according to the changed match value;

(c) delaying a period of time;

(d) checking whether the modified signal is released, if yes, performing step (e); otherwise, performing the step (b);

(e) storing the match value into the storage;

(f) loading the match value from the storage;

(g) calculating the number of variation of the potential so as to generate a count value;

(h) checking whether the count value is equal to the match value, if yes, performing step (i); otherwise, performing the step (g);

(i) changing the potential of a wave, and resetting the count value and then performing the step (g).

10. The method of wave frequency calibration for remote controller as cited in claim 9, wherein the step (a) can be a step of pressing and holding one of the button on the remote controller.

11. The method of wave frequency calibration for remote controller as cited in claim 10, wherein the step (d) can be a step of releasing the button.

12. The method of wave frequency calibration for remote controller as cited in claim 9, wherein the step (b) can be a step of changing the match value based on a specific series.

13. The method of wave frequency calibration for remote controller as cited in claim 9, wherein the period of the wave is a multiple of the period of the base wave.

14. The method of wave frequency calibration for remote controller as cited in claim 9, wherein the maximum error of the period of the wave is the half period of the base wave.

15. The method of wave frequency calibration for remote controller as cited in claim 9, wherein the method can be implemented by one of the following: software, hardware and firmware.

* * * * *